(12) United States Patent  (10) Patent No.: US 7,609,194 B2
Makabe et al.  (45) Date of Patent: Oct. 27, 2009

(54) CLOCK SIGNAL GENERATING DEVICE AND ANALOG-DIGITAL CONVERSION DEVICE

(75) Inventors: Yoshikazu Makabe, Osaka (JP); Ikuo Hidaka, Kyoto (JP); Koji Oka, Osaka (JP); Toshiaki Ozeki, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 11/964,943

(22) Filed: Dec. 27, 2007

(65) Prior Publication Data

US 2008/0158035 A1  Jul. 3, 2008

(30) Foreign Application Priority Data

Dec. 27, 2006  (JP) .............................. 2006-351203

(51) Int. Cl.
 *H03M 1/12* (2006.01)
(52) U.S. Cl. ...................... 341/155; 341/122
(58) Field of Classification Search ................. 341/155, 341/122; 327/107, 236, 141, 143
See application file for complete search history.

(56) References Cited

U.S. PATENT DOCUMENTS

| 5,552,732 | A | * | 9/1996 | Huang ......................... 327/116 |
| 5,923,190 | A | | 7/1999 | Yamaguchi |
| 6,310,653 | B1 | * | 10/2001 | Malcolm et al. ............. 348/537 |
| 6,642,747 | B1 | * | 11/2003 | Chiu ............................. 327/40 |
| 7,165,199 | B2 | * | 1/2007 | Warren ........................ 714/724 |
| 7,515,666 | B2 | * | 4/2009 | Milton et al. ................ 375/354 |
| 2008/0100354 | A1 | * | 5/2008 | Lee ............................... 327/158 |
| 2008/0265958 | A1 | * | 10/2008 | Beaulaton et al. ........... 327/156 |

FOREIGN PATENT DOCUMENTS

| JP | 10-022799 A | 1/1998 |
| JP | 2000-216762 A | 8/2000 |
| JP | 2001-217886 A | 8/2001 |

OTHER PUBLICATIONS

J. Arias, V. Boccuzzi, L. Quintanilla, L. Enriquez, D. Bisbal, M. Banu, and J. Barbolla, "Low-Power Pipeline ADC for Wireless LANs", IEEE Journal of Solid-State Circuits, Aug. 2004, pp. 1338-1340, vol. 39, No. 8, Spain.

* cited by examiner

*Primary Examiner*—Brian Young
(74) *Attorney, Agent, or Firm*—RatnerPrestia

(57) ABSTRACT

A first Delayed Flip Flop includes a first D input terminal, a first clock input terminal, a first output terminal outputting a signal inputted to the first D input terminal based on the clock signal, and a first inversion output terminal inverting and outputting the signal inputted to the first D input terminal and outputting the signal to the first D input terminal as a feedback. A second Delayed Flip Flop includes a second D input terminal receiving the output from the first output terminal of the first Delayed Flip Flop, a second clock input terminal, and a second output terminal outputting the signal inputted to the second D input terminal as a first output based on the clock signal. A third Delayed Flip Flop includes a third D input terminal receiving the output from the first inversion output terminal of the first Delayed Flip Flop, a third clock input terminal, and a third output terminal outputting the signal inputted to the third D input terminal as a second output based on the clock signal. The first output and the second output have signal waveforms inverted at the same timing.

5 Claims, 8 Drawing Sheets

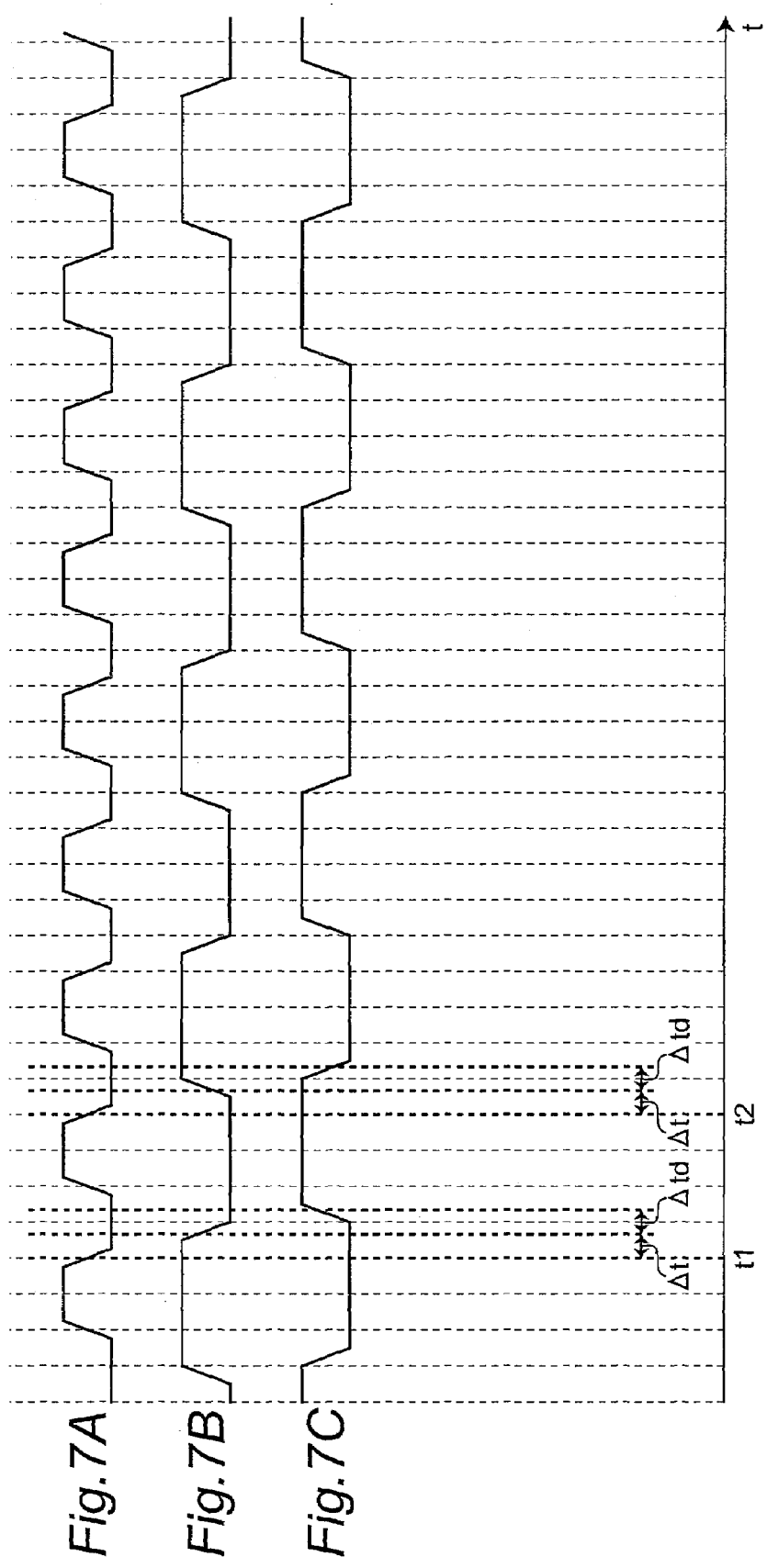

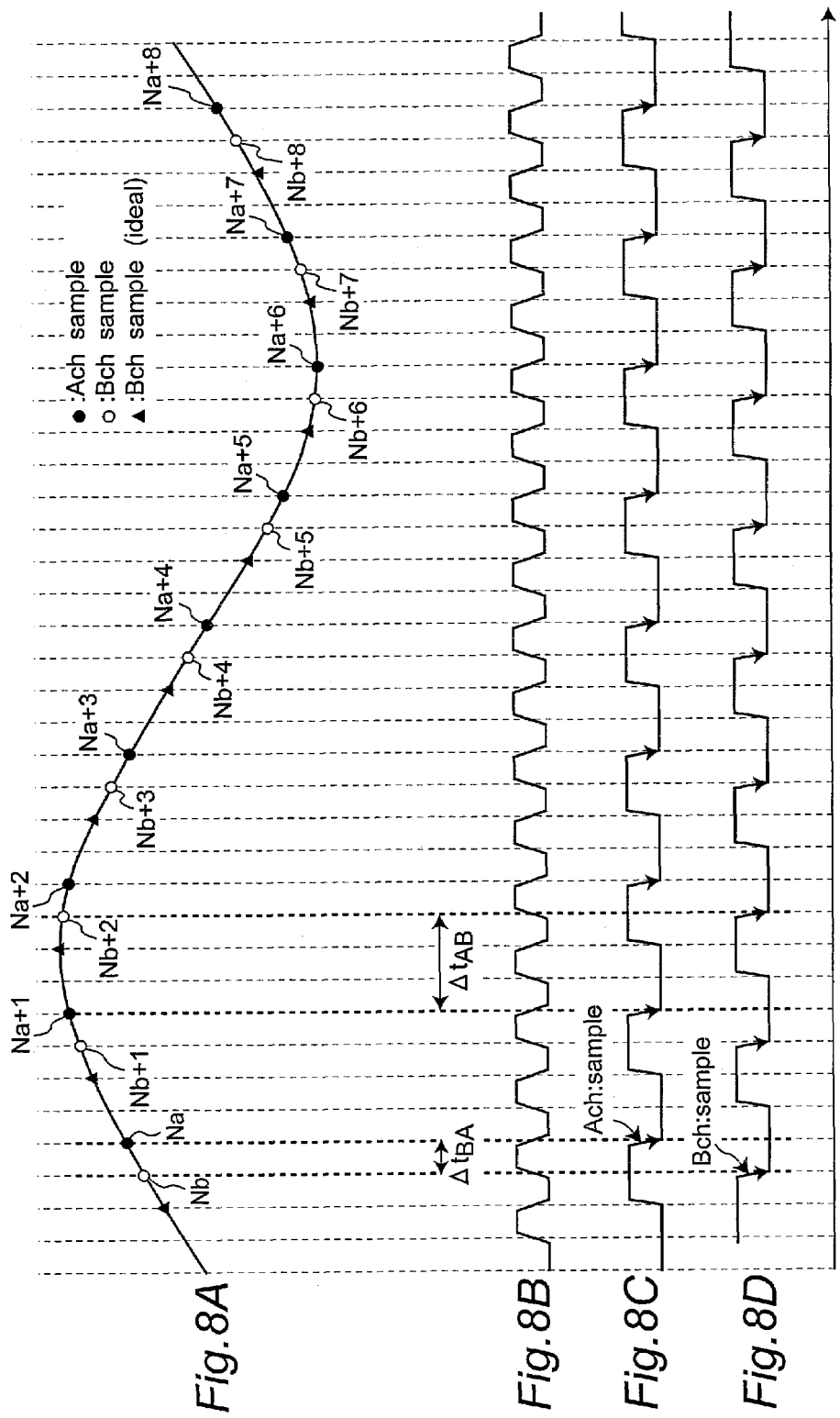

CLOCK SIGNAL GENERATING DEVICE AND ANALOG-DIGITAL CONVERSION DEVICE

BACKGROUND OF THE INVENTION

1. Field of the Invention

This application claims priority based on Japanese Patent Application No. 2006-351203 filed in Japan on Dec. 27, 2006, the disclosure of which is incorporated herein by reference.

The present invention relates to a clock signal generating device and an analog-digital conversion device including the clock signal generating device.

2. Description of the Related Art

In recent years, a technique for A/D conversion with high precision and at high speed in a communication filed such as a wireless LAN or a imaging technique such as a digital TV has been required. Among techniques to speed up the A/D conversion, there is an interleaved constitution in which A/D converters of both A/B channels are processed in parallel in a time-division manner, and a double sampling technique in which an operation amplifier is commoditized among the interleaves, as described in "Low-Power Pipeline ADC for Wireless LANs", IEEE Journal of Solid-State Circuits, Vol. 39, No. 8, August 2004. Although high-speed A/D conversion is realized by the interleaved constitution, the problem is that when the sampling timing difference is generated between both A/B channels, the characteristics are degraded because of the timing difference.

The A/D converter switches between a sampling period and a holding period according to a clock signal. Especially, the A/D conversion device having the interleaved constitution processes the A/D converters of both A/B channels in parallel in the time-division manner, according to two mutually inverted (phase difference is 180°) clock signals. Conventionally, the two mutually inverted clock signals are provided by a clock signal generating device 50 as shown in FIG. 6, for example.

FIG. 6 is a circuit diagram showing a general circuit constitution of the conventional clock signal generating device 50. The clock signal generating device 50 includes a D-flip-flop (Delayed Flip Flop (Delayed FF) 101. In addition, the clock signal generating device 50 includes a master clock signal input terminal 91 and two output terminals 12 and 13. The master clock signal input terminal 91 is connected to a clock input terminal of the Delayed Flip Flop 101. A non-inversion output signal terminal (Q) of the Delayed Flip Flop 101 is connected to the output terminal 12. In addition, an inversion output terminal (NQ) of the Delayed Flip Flop 101 is connected to the output terminal 13 and to a D input terminal as a feedback. Two clock signals divided from a master clock signal and having substantially phase difference of 180° are outputted from the two output terminals 12 and 13. Note that according to the A/D converter having the interleaved constitution in which the A/D converters of both A/B channels are processed in parallel in the time-division manner, the two clock signals outputted are inputted to an A channel-side sampling clock signal output terminal and a B channel-side sampling clock signal output terminal.

FIGS. 7A to 7C show waveform charts at each part of the conventional clock signal generating device 50 shown in FIG. 6. Referring to FIGS. 7A to 7C, FIG. 7A shows a waveform of the master clock signal (MCLK), FIG. 7B shows a waveform [CLK_A] of the non-inversion output (Q) of the Delayed Flip Flop 101, and FIG. 7C shows a waveform [CLK_B] of the inversion output (NQ) of the Delayed Flip Flop 101.

Next, the operation of the clock signal generating device 50 will be described with reference to FIGS. 7A to 7C.

(a) First, when the master clock signal comes to fall at time t1, as shown in FIG. 7A, it is assumed that the Q output is high and the NQ output is low just before the time t1. In this case, according to the Delayed Flip Flop 101, after the signal falls, Q output timing (tQ) comes after a lapse of Δt from the time t1. Thus, the Q output is switched from high to low after a lapse of Δt from the time t1. Meanwhile, NQ output timing (tNQ) comes after a lapse of (Δt+Δtd) from the time t1. That is, the NQ output is later than the Q output by Δtd. Thus, the NQ output is switched from low to high after a lapse of (Δt+Δtd) from the time t1.

(b) In addition, when the master clock signal comes to fall at time t2, in the case where the Q output is low and the NQ output is high just before the time t2, the Q output is switched from low to high after a lapse of Δt from the time t2 and NQ output is switched from high to low after a lapse of (Δt+Δtd) from the time t2.

As described above, the two clock signals divided from the master clock signal and having the phase difference of about 180° are inputted to the Q output 12 and the NQ output 13 by the operation of the Delayed Flip Flop 101.

According to the clock signal generating device 50 in the conventional example, the NQ output signal of the Delayed Flip Flop 101 is fed back to the D input terminal of the Delayed Flip Flop 101. In addition, mutually inverted signals are outputted from the Q output and the NQ output. Thus, according to the clock signal generating device 50, the master clock signal is divided into the two mutually inverted clock signals outputted.

However, the conventional clock signal generating device 50 shown in FIG. 6 and the A/D converter having the interleaved constitution using the above device have the following problem. That is, as shown in FIGS. 7B and 7C, according to the Delayed Flip Flop 101, a delay (Δtd) is generated between the Q output from the non-inversion output terminal (Q) and the NQ output from the inversion output terminal (NQ) because of the inversion. That is, according to the two clock signals outputted from the conventional clock signal generating device 50, their phase difference is not just 180° in a narrow sense and a difference is caused by the delay time Δtd. Therefore, the problem is that a difference in sampling time is caused between both channels in the A/D converter having the interleaved constitution using the above device.

<Sampling Point Difference Between Both Channels>

The problem in the A/D converter having the interleaved constitution using the conventional clock signal generating device 50 will be described.

When it is assumed that as the two clock signals, an A channel-side sampling clock signal [CLK_A] and a B channel-side sampling clock signal [CLK_B] are inputted to the A/D converter having the interleaved constitution in which the A/D converts of both channels are processed in parallel in the time-division manner, the delay Δtd is generated between a rising edge of the A channel-side sampling clock signal [CLK_A] and a falling edge of the B channel-side sampling clock signal [CLK_B]. Since this delay Δtd causes that the sampling point of the inputted analog signal does not coincide with an ideal point on each of the A channel side and B channel side, the characteristics of the A/D converter is degraded.

FIGS. 8A to 8D are timing charts showing the relation between the analog input signal and sampling timing in the A/D converter. Referring to FIGS. 8A to 8D, FIG. 8A shows an analog input signal waveform, FIG. 8B shows a master clock signal waveform, FIG. 8C shows an A channel-side sampling clock signal [CLK_A] waveform, and FIG. 8D shows a B channel-side sampling clock signal [CLK_B] waveform. In FIGS. 8A to 8D, the falling edge of each sampling clock is set to the sampling point.

In an ideal case, according to the sampling of the inputted analog signal, A channel-side sampling is performed at the falling edge of the CLK_A (FIG. 8A: ●) and B channel-side sampling is performed at the falling edge of the CLK_B (FIG. 8A: ▲) alternately. In this case, the sampling points of both A/B channels are provided at the same interval with respect to the analog signal inputted as shown by ● and ▲ in FIG. 8A.

However, when the conventional clock signal generating device 50 is used, the delay Δtd is generated between the Q output and NQ output of the Delayed Flip Flop due to inversion. Therefore, the delay Δtd is generated between the rising edge of the CLK_A and the falling edge of the CLK_B and between the falling edge of the CLK_A and the rising edge of the CLK_B. As a result, the sampling points of the A/B channels are not provided at the equal intervals as shown by ● and ○ in FIG. 8A, and an analog signal level off the ideal sampling point is sampled. Thus, the analog-digital conversion precision is degraded due to an error caused by the difference in sampling time between the A channel and the B channel.

In this background, there is a strong demand for a clock signal generating device capable of outputting two mutually inverted clock signals having phase differences of just 180°, to improve analog-digital conversion precision without causing a difference in sampling timing between both channels and without being affected by an error between both channels.

SUMMARY OF THE INVENTION

In order to solve the above problems, it is an object of the present invention to provide a clock signal generating device outputting two clock signals having signal waveforms mutually inverted at the same timing.

In a clock signal generating device according to the present invention, the clock signal generating device including first, second and third Delayed Flip Flops. The first Delayed Flip Flop includes: a first D input terminal; a first clock input terminal receiving a clock signal; a first output terminal holding and outputting a signal inputted to the first D input terminal, based on the clock signal; and a first inversion output terminal inverting and outputting the signal inputted to the first D input terminal and outputting the signal to the first D input terminal as a feedback, based on the clock signal. The second Delayed Flip Flop includes: a second D input terminal receiving the output from the first output terminal of the first Delayed Flip Flop; a second clock input terminal receiving the clock signal; and a second output terminal holding a signal inputted to the second D input terminal and outputting it as a first output, based on the clock signal. The third Delayed Flip Flop includes: a third D input terminal receiving the output from the first inversion output terminal of the first Delayed Flip Flop; a third clock input terminal receiving the clock signal; and a third output terminal holding a signal inputted to the third D input terminal and outputting the signal as a second output, based on the clock signal. Thereby, the first output from the second output terminal of the second Delayed Flip Flop and the second output from the third output terminal of the third Delayed Flip Flop have signal waveforms inverted at the same timing.

In addition, non-inversion outputs of the second Delayed Flip Flop and the third Delayed Flip Flop are same in timing with respect to the clock signal.

Furthermore, an IC chip, wherein the clock signal generating device may be mounted thereon.

The analog-digital conversion device according to the present invention including: the clock signal generating device; and an A/D converter converting an inputted analog signal to a digital signal by switching a sampling period and a holding period, using the first output and the second output having the mutually inverted signal waveforms, outputted from the clock signal generating device.

Also, the A/D converter includes: an A channel-side converter converting the inputted analog signal to a digital signal by switching a sampling period and a holding period on the A channel side, using the first output from the clock signal generating device, and a B channel-side converter converting the inputted analog signal to a digital signal by switching a sampling period and a holding period on the B channel side, using the second output from the clock signal generating device.

In addition, an IC chip, wherein the analog digital conversion device may be mounted thereon.

According to the clock signal generating device and the analog-digital conversion device in the present invention, three Delayed Flip Flops are combined. According to the first flip-flop, the master clock signal is divided into two by inputting its NQ output for feedback as the D input and the two clock signals having a phase difference of almost 180° from the Q output and the NQ output. Then, the Q output of the first flip-flop is inputted to the second flip-flop and the NQ output of the first flip-flop is inputted to the third flip-flop, whereby the two clock signals having mutually inverted signal waveforms having a phase difference of just 180° can be outputted from the Q outputs at the same timing.

Furthermore, according to the A/D conversion device having the interleaved constitution using the clock signal generating device, the two clock signals having the mutually inverted signal waveforms having the phase difference of just 180° in the clock signal generating device can be used for switching the sampling and holding timings of the A and B channels, respectively. Thus, the sampling time difference between the A and B channels can be eliminated and analog-digital conversion precision can be improved.

BRIEF DESCRIPTION OF THE DRAWINGS

The present invention will become readily understood from the following description of preferred embodiments thereof made with reference to the accompanying drawings, in which like parts are designated by like reference numeral and in which:

FIGS. 7A to 7C waveform diagrams of each part of the conventional clock signal generating device; and FIGS. 8A to 8D are timing charts showing an analog input signal and its sampling timing in a conventional A/D converter.

DETAILED DESCRIPTION OF THE PREFERRED EMBODIMENTS

Figure 1:
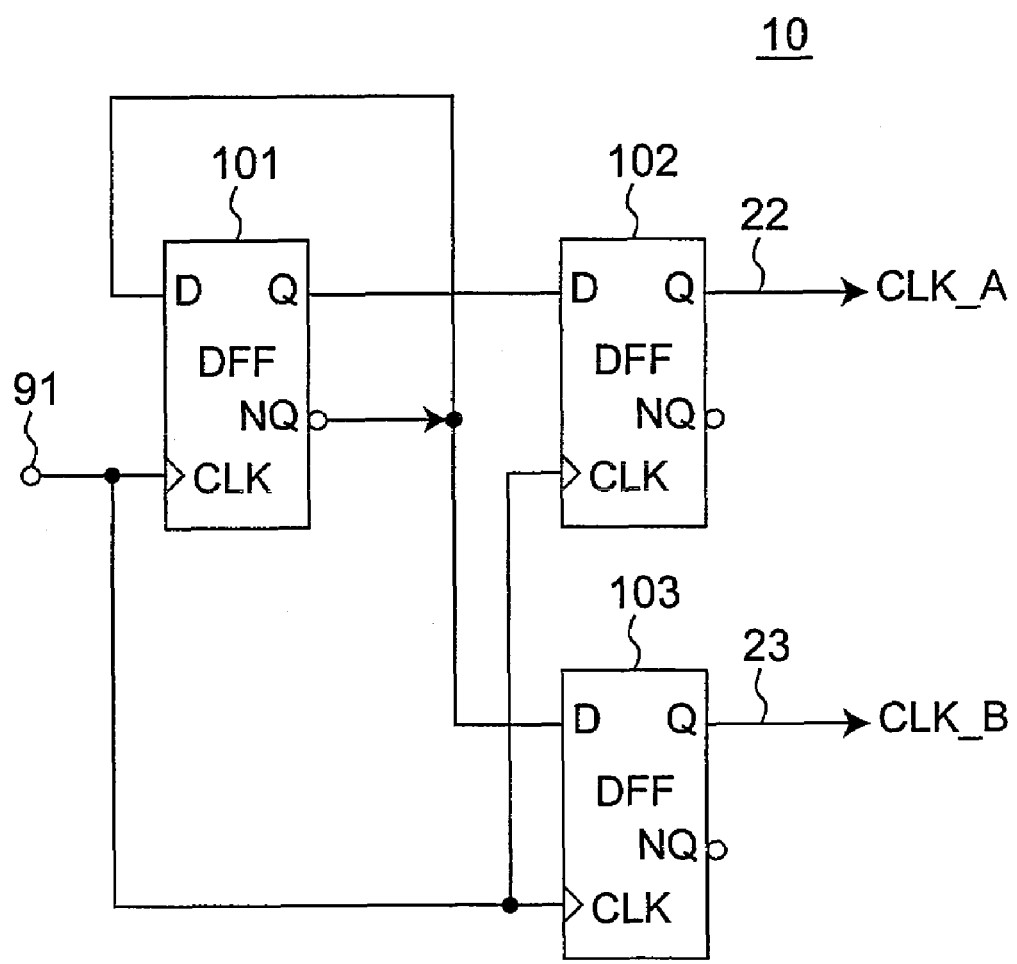
FIG. 1 is a circuit diagram showing a constitution of a clock signal generating device according to first embodiment of the present invention.

A clock signal generating device and an A/D conversion device according to embodiments of the present invention will be described with reference to the accompanying drawings hereinafter. In addition, the same reference characters are allotted to the same members substantially in the drawings.

First Embodiment

FIG. 1 is a circuit diagram showing a constitution of a clock signal generating device 10 according to first embodiment of the present invention. The clock signal generating device 10 includes three Delayed Flip Flops 101 to 103. In addition, it includes a master clock signal input terminal 91 and two output terminals 22 and 23. A master signal is divided into two clock signals having mutually inverted signal waveforms in which their phase difference is 180° and the two clock signals are outputted at the same time from the two output terminals 22 and 23.

Next, the clock signal generating device 10 will be described in detail.

First, the master clock signal input terminal 91 is connected to a clock terminal of the first Delayed Flip Flop 101, a clock terminal of the second Delayed Flip Flop 102, and a clock terminal of the third Delayed Flip Flop 103. In addition, an inversion output terminal (NQ) of the first Delayed Flip Flop 101 is connected to a D input terminal of the first Delayed Flip Flop 101 and to a D input terminal of the third Delayed Flip Flop 103. Meanwhile, a non-inversion output terminal (Q) of the first Delayed Flip Flop 101 is connected to a D input terminal of the second Delayed Flip Flop 102.

In addition, a non-inversion output terminal (Q) of the second Delayed Flip Flop 102 is connected to the output terminal 22, and a non-inversion output terminal (Q) of the third Delayed Flip Flop 103 is connected to the output terminal 23. When the clock signal generating device is used in an A/D conversion device including an interleaved constitution having both A/B channels, the two outputs can be inputted as A channel-side sampling clock signal and B channel-side sampling clock signal.

In addition, the clock signal generating device 10 may be mounted on an IC chip.

Figure 2:
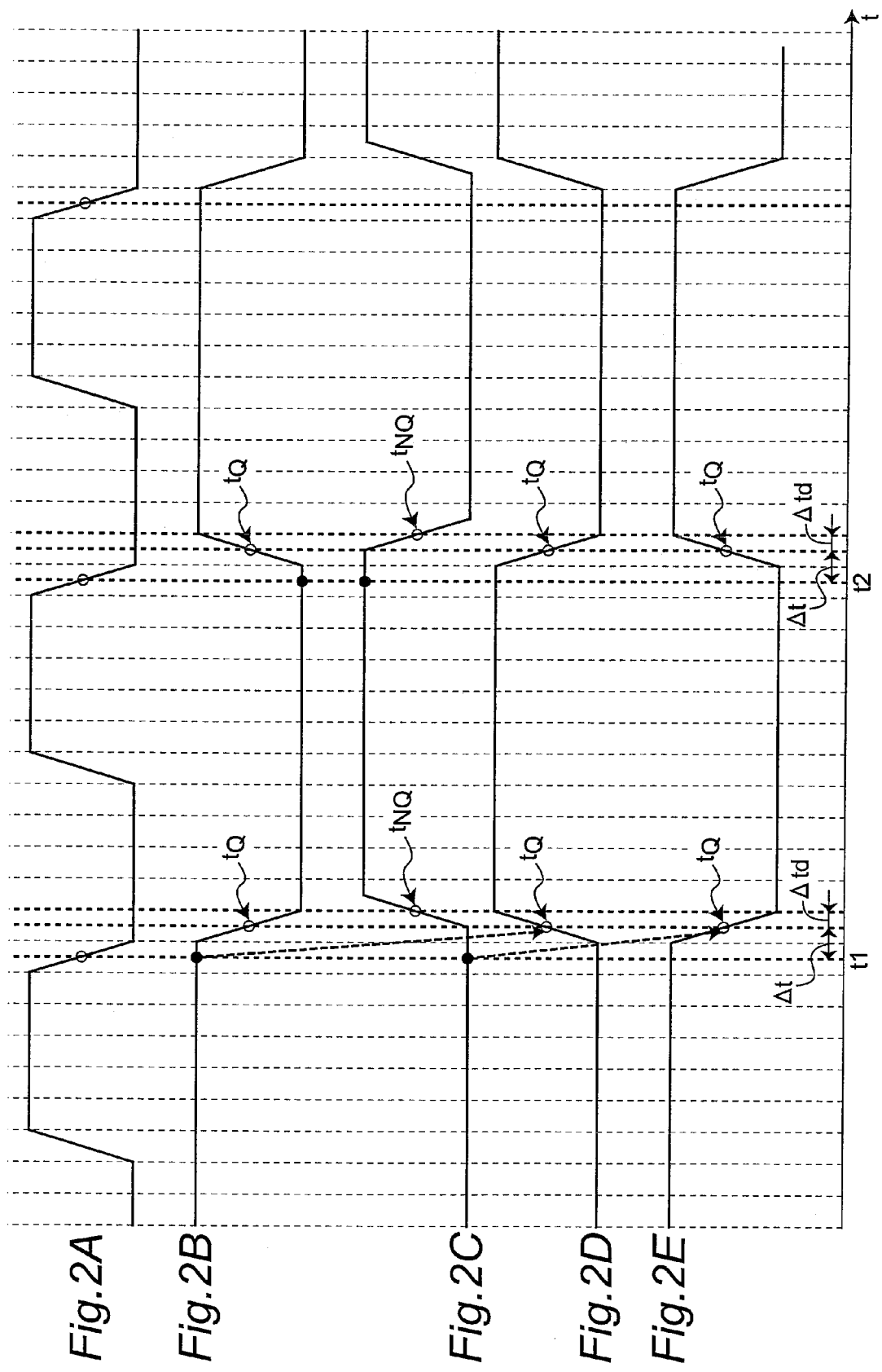
FIGS. 2A to 2E are waveform diagrams showing each part of the clock signal generating device according to first embodiment of the present invention.

FIGS. 2A to 2E are waveform diagrams showing each part of the clock signal generating device 10. Referring to FIGS. 2A to 2E, FIG. 2A shows a waveform of a master clock signal (MCLK), FIG. 2B shows a waveform of the non-inversion output (Q) of the first Delayed Flip Flop 101, FIG. 2C shows a waveform of the inversion output (NQ) of the first Delayed Flip Flop 101, FIG. 2D shows a waveform [CLK_A] of the non-inversion output (Q) of the second Delayed Flip Flop 102, and FIG. 2E shows a waveform [CLK_B] of the non-inversion output (Q) of the third Delayed Flip Flop 103.

Next, the operation of the clock signal generating device 10 will be described with reference to FIGS. 2A to 2E.

(a) First, when the master clock signal MCLK comes to fall at a time t1, in a case where the Q output of the first Delayed Flip Flop 101 is high and the NQ output of the first Delayed Flip Flop 101 is low just before the time t1, the Q output of the first Delayed Flip Flop 101 is switched from high to low after a lapse of Δt from the time t1, at a time (tQ). Furthermore, the NQ output of the first Delayed Flip Flop 101 is switched from low to high after a lapse of (Δt+Δtd) from the time t1, at a time (tNQ).

There is a delay of Δtd between the Q output and NQ output of the first Delayed Flip Flop 101 as described above. Therefore, there is a timing difference in inversion between the two outputs by Δtd.

(b) According to the second Delayed Flip Flop 102, the Q output (high) of the first Delayed Flip Flop 101 is inputted to the D input terminal of the second Delayed Flip Flop 102 just before t1. When the master clock signal falls at the time t1, the Q output of the second Delayed Flip Flop 102 becomes high after a lapse of Δt from the time t1 (Q output timing: tQ).

(c) According to the third Delayed Flip Flop 103, the NQ output (low) of the first Delayed Flip Flop 101 is inputted to the D input terminal of the third Delayed Flip Flop 103 just before the time t1. When the master clock signal falls at the time t1, the Q output of the third Delayed Flip Flop 103 becomes low after a lapse of Δt from the time t1 (Q output timing: tQ).

As described above, according to the clock signal generating device 10, the Q output of the first Delayed Flip Flop 101 is inputted to the D input of the second Delayed Flip Flop 102 and the NQ output of the first Delayed Flip Flop 101 is inputted to the D input of the third Delayed Flip Flop 103. Although there is a delay of Δtd between the Q output and the NQ output of the first flip-flop 101, when the second and third Delayed Flip Flops 102 and 103 having the same Q output timing are used, two clock signals divided from the master clock signal and having a phase difference of 180° and mutually inverted signal waveforms are outputted as their Q outputs.

Furthermore, a description will be made of a mechanism in which when the second and third Delayed Flip Flops 102 and 103 are used, the two clock signals having the phase difference of 180° and the mutually inverted signal waveforms are outputted as their two Q outputs.

Here, just before the master clock signal MCLK falls (FIG. 2A: time t1), the Q output signal (FIG. 2B) of the first Delayed Flip Flop 101 inputted to the D input terminal of the second Delayed Flip Flop 102 and the NQ output signal (FIG. 2C) of the first Delayed Flip Flop 101 inputted to the D input terminal of the third Delayed Flip Flop 103 have been already determined. Furthermore, the second Delayed Flip Flop 102 and the third Delayed Flip Flop 103 have the same timing from the falling edge of the clock signal to the Q output (tQ: after a lapse of Δt from the time t1). Therefore, when the master clock signal MCLK falls, the Q output signal 22 from the second Delayed Flip Flop 102 and the Q output signal 23 from the third Delayed Flip Flop 103 are outputted after a lapse of Δt from the time t1 at the same timing without any delay. Furthermore, the delay Δtd between the Q output and the NQ output of the first Delayed Flip Flop 101 is very small and their values of the signals at the falling (FIGS. 2B and 2C time t1) are opposite such as high and low or low and high. Thus, the Q output signal 22 from the second Delayed Flip Flop 102 and the Q output signal 23 from the third Delayed Flip Flop 103 are outputted as the two clock signals having the mutually inverted signal waveforms at the same timing (tQ).

According to the clock signal generating device 10 in first embodiment of the present invention, the two clock signals provided by dividing the master clock input signal into two and having the mutually inverted signal waveforms having the phase differences of just 180° can be outputted.

Second Embodiment

Figure 3:
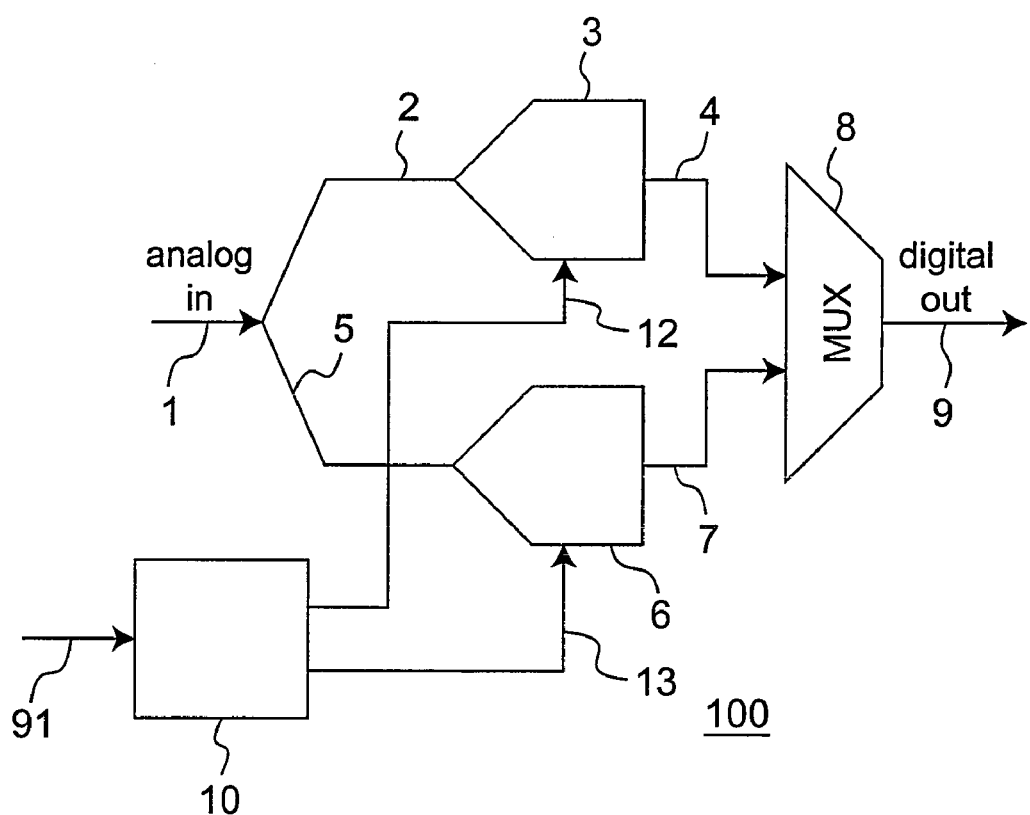
FIG. 3 is a block diagram showing a constitution of an A/D conversion device according to second embodiment of the present invention.
Figure 4:
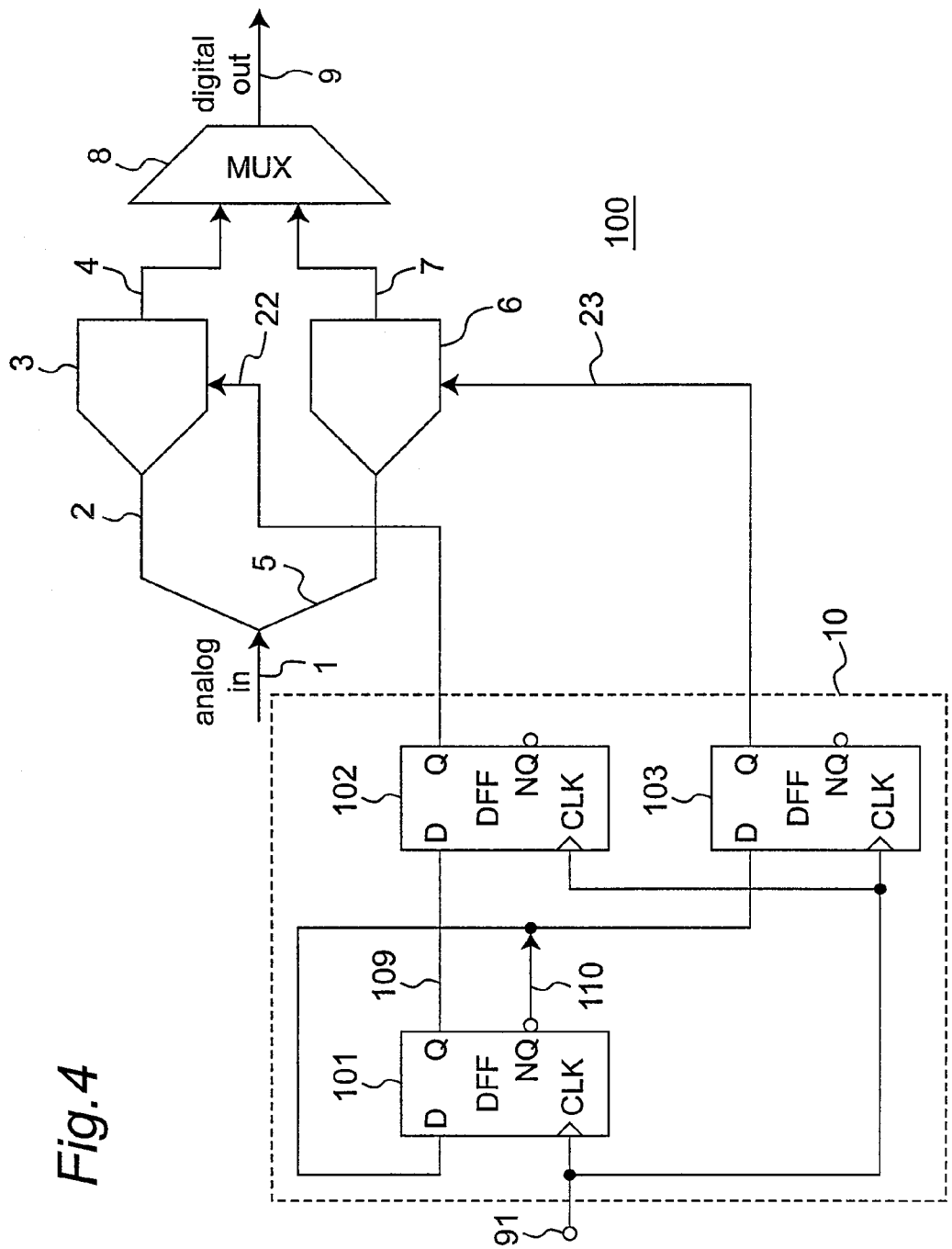
FIG. 4 is a circuit diagram when the clock signal generating device shown in FIG. 1 is used in the A/D converter in FIG. 3.

FIG. 3 is a block diagram showing a constitution of an analog-digital (A/N) conversion device 100 having an interleaved constitution according to second embodiment of the present invention. FIG. 4 is a block diagram showing a detailed constitution when the clock signal generating device 10 according to first embodiment is used as a clock signal generating device shown in FIG. 3. The characteristic of the A/D conversion device 100 is to include the clock signal generating device 10 according to first embodiment of the present invention. Furthermore, the A/D conversion device 100 includes the clock signal generating device 10, an analog signal input terminal 1, a one-side (A channel-side) A/D converter 3, the other-side (B channel-side) A/D converter 6, a multiplexer circuit 8, and a digital signal output terminal 9. Since the constitution of the clock signal generating device 10 is the same as the clock signal generating device 10 according to first embodiment of the present invention shown in FIG. 1, its description will be omitted.

The A channel-side A/D converter 3 includes an A channel-side analog signal input terminal 2 and an A channel-side digital signal output terminal 4, and the B channel-side A/D converter 6 includes a B channel-side analog signal input terminal 5 and a B channel-side digital signal output terminal 7.

In addition, this analog-digital conversion device 100 may be mounted on an IC chip.

Next, the operation of the A/D conversion device having the interleaved constitution as shown in FIG. 3 will be described.

(a) An analog signal inputted to the analog signal input terminal 1 is outputted to the A channel-side analog signal input terminal 2 and the B channel-side analog signal input terminal 5.

(b) The analog signal inputted to the A channel-side analog signal input terminal 2 is converted from the analog signal to a digital signal by the A channel-side A/D converter 3, and the digital signal is outputted from the A channel-side digital signal output terminal 4.

(c) Similarly, the analog signal inputted to the B channel-side analog signal input terminal 5 is converted from the analog signal to a digital signal by the B channel-side A/D converter 6, and the digital signal is outputted from the B channel-side digital signal output terminal 7.

(d) The digital signal outputted from the A channel-side digital signal output terminal 4 and the digital signal outputted from the B channel-side digital signal output terminal 7 are synthesized by the multiplexer circuit 8 and a digital signal is outputted from a digital signal output terminal 9.

Furthermore, a sampling timing of both A/B channels in the A/D conversion device 100 will be described.

(a) A master clock signal inputted to a master clock signal input terminal 91 is divided into an A channel-side sampling clock signal and a B channel-side sampling clock signal by the clock signal generating device 10.

(b) The A channel-side sampling clock signal is outputted from an A channel-side sampling clock signal output terminal 22, and the B channel-side sampling clock signal is outputted from a B channel-side sampling clock signal output terminal 23. In addition, as described above, the A channel-side sampling clock signal and the B channel-side sampling clock signal have the mutually inverted signal waveforms (phase difference between them is just 180°).

(c) A sampling period and a holding period of the A channel-side A/D converter 3 are switched by the A channel-side sampling clock signal [CLK_A] and a sampling period and a holding period of the B channel-side A/D converter 6 are switched by the B channel-side sampling clock signal [CLK_B].

According to the A/D conversion device 100, the master clock input signal is divided into the two clock signals having the mutually inverted signal waveforms in which the phase difference is just 180° by the clock signal generating device 10 in first embodiment. The two clock signals can be used to switch the sampling/holding timings of both A/B channels. Thus, according to the A/D conversion device 100, the intervals of sampling timings of both channels can be equal without generating an error in the sampling timings of both A/B channels, so that analog-digital conversion precision can be improved.

Figure 5:
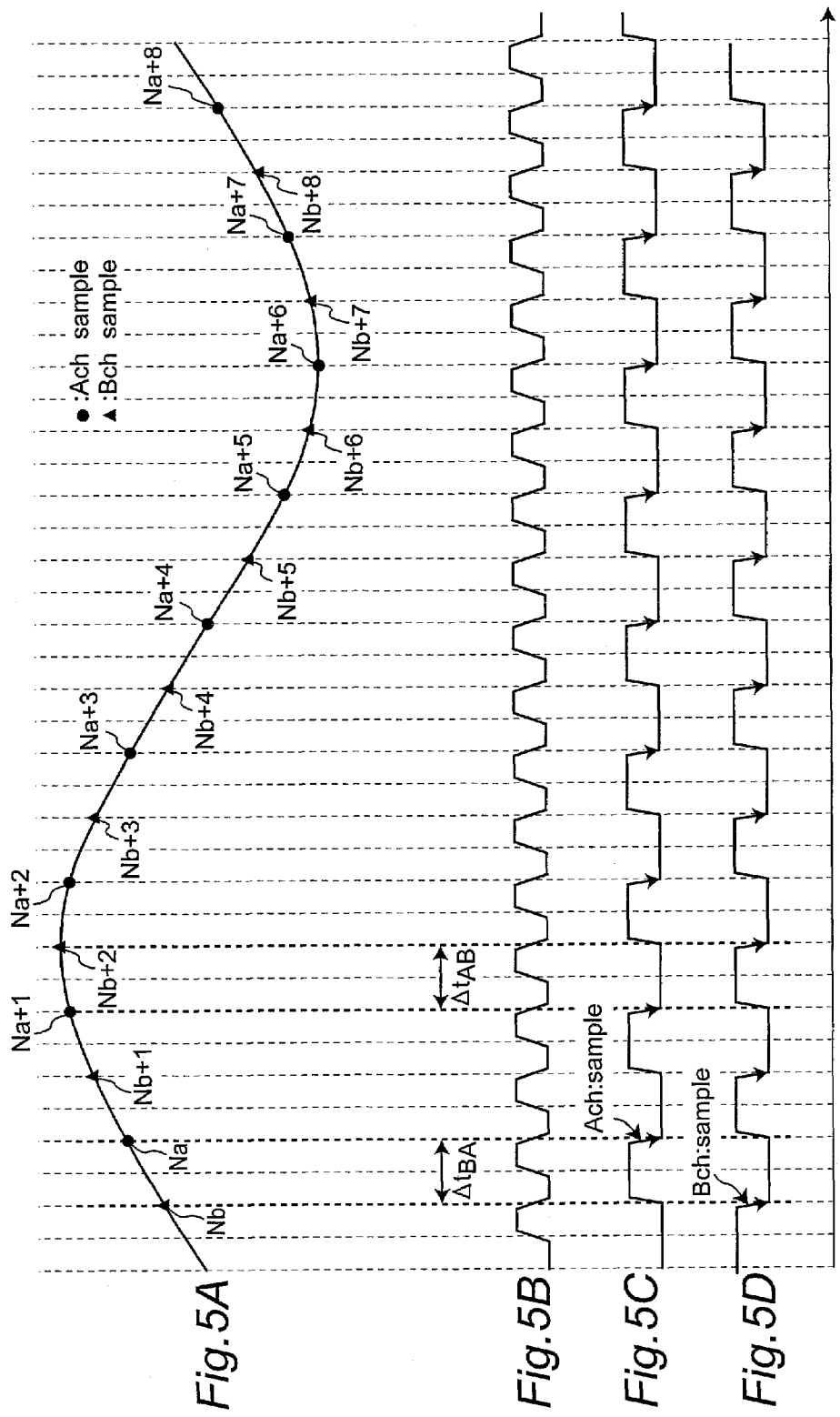
FIGS. 5A to 5D are timing charts showing an analog input signal and sampling timing in the A/D conversion device according to second embodiment of the present invention.
Figure 6:
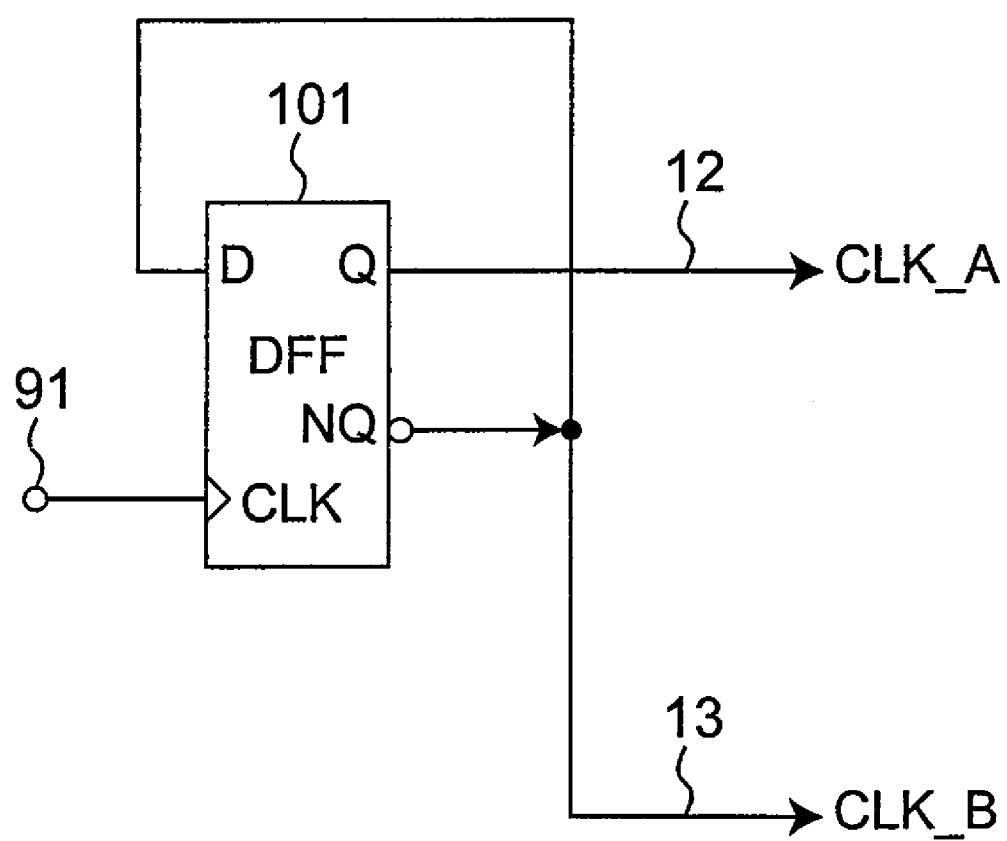
FIG. 6 is a circuit diagram showing a constitution of a conventional clock signal generating device.

FIGS. 5A to 5D are timing charts showing the relation between the analog input signal and its sampling timing in the A/D conversion device 100 according to second embodiment of the present invention. Referring to FIGS. 5A to 5D, FIG. 5A shows an analog input signal waveform, FIG. 5B shows a master clock signal waveform, FIG. 5C shows an A channel-side sampling clock signal [CLK_A] waveform, and FIG. 5D shows a B channel-side sampling clock signal [CLK_B] waveform.

In the A/D conversion device 100, a description will be made of a mechanism in which the sampling timings of both A/B channels are provided at the same interval with reference to FIGS. 5A to 5D. A falling edge of each sampling clock signal in FIGS. 5C and 5D is set to a sampling point.

As described above, the A channel-side sampling clock signal [CLK_A] and the B channel-side sampling clock signal [CLK_B] generated by the clock signal generating device 10 have the mutually inverted signal waveforms having the phase difference of just 180°. Therefore, the rising edge of the CLK_A coincides with the falling edge of the CLK_B, and the falling edge of the CLK_A coincides with the rising edge of the CLK_B. That is, a time ($\Delta tBA$) from the falling edge of the CLK_B (FIG. 5A: ▲) to the falling edge of the CLK_A (FIG. 5A: ●) is equal to a time ($\Delta TAB$) from the falling edge of the CLK_A (FIG. 5A: ●) to the falling edge of the CLK_B (FIG. 5A: ▲), —and there is no difference in time. Therefore, according to the A/D conversion device 100, the inputted analog signal is sampled at the falling edge of the CLK_A (FIG. 5A: ●) and at the falling edge of the CLK_B (FIG. 5A: ▲) alternately, and the sampling points are provided at the same intervals for the inputted analog signal as shown in FIGS. 5C and 5D. Thus, the sampling timings of both A/B channels can be the same and the sampling timings of both A/B channels can be provided at the same intervals, so that analog-digital conversion precision can be improved.

The clock signal generating device according to the present invention can be advantageously applied to an A/D conversion device having the interleaved constitution.

Although the present invention has been described in connection with the preferred embodiments thereof with reference to the accompanying drawings, it is to be noted that various changes and modifications are apparent to those skilled in the art. Such changes and modifications are to be understood as included within the scope of the present invention as defined by the appended claims, unless they depart therefrom.

What is claimed is:

1. A clock signal generating device comprising first, second and third Delayed Flip Flops, wherein
   the first Delayed Flip Flop comprises:
   a first D input terminal;
   a first clock input terminal operable to receive a clock signal;
   a first output terminal operable to hold and output a signal inputted to the first D input terminal, based on the clock signal; and a first inversion output terminal operable to invert and output the signal inputted to the first D input terminal and output the signal to the first D input terminal as a feedback, based on the clock signal, the second Delayed Flip Flop comprises:

a second D input terminal operable to receive the output from the first output terminal of the first Delayed Flip Flop;

a second clock input terminal operable to receive the clock signal; and a second output terminal operable to hold a signal inputted to the second D input terminal and output the signal as a first output, based on the clock signal, the third Delayed Flip Flop comprises:

a third D input terminal operable to receive the output from the first inversion output terminal of the first Delayed Flip Flop;

a third clock input terminal operable to receive the clock signal; and a third output terminal operable to hold a signal inputted to the third D input terminal and output the signal as a second output, based on the clock signal, and wherein the first output from the second output terminal of the second Delayed Flip Flop and the second output from the third output terminal of the third Delayed Flip Flop have signal waveforms inverted at the same timing, wherein non-inversion outputs of the second Delayed Flip Flop and the third Delayed Flip Flop are same in timing with respect to the clock signal.

2. An IC chip, wherein the clock signal generating device according to claim 1 is mounted thereon.

3. An analog-digital conversion device comprising:

the clock signal generating device according to claim 1; and an A/D converter operable to convert an inputted analog signal to a digital signal by switching a sampling period and a holding period, according to the first output and the second output having the mutually inverted signal waveforms, outputted from the clock signal generating device.

4. The analog-digital conversion device according to claim 3, wherein the A/D converter comprises:

an A channel-side converter operable to convert the inputted analog signal to a digital signal by switching a sampling period and a holding period on the A channel side, according to the first output from the clock signal generating device, and a B channel-side converter operable to convert the inputted analog signal to a digital signal by switching a sampling period and a holding period on the B channel side, according to the second output from the clock signal generating device.

5. An IC chip, wherein the analog-digital conversion device according to claim 3 is mounted thereon.

* * * * *